(12) United States Patent
Mikami

(10) Patent No.: US 9,066,461 B2
(45) Date of Patent: Jun. 23, 2015

(54) BASE MEMBER, MANUFACTURING METHOD FOR ELECTRONIC DEVICE, AND ELECTRONIC APPARATUS

(71) Applicant: SEIKO EPSON CORPORATION, Tokyo (JP)

(72) Inventor: Masaru Mikami, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 146 days.

(21) Appl. No.: 13/774,265

(22) Filed: Feb. 22, 2013

(65) Prior Publication Data

US 2013/0223037 A1 Aug. 29, 2013

(30) Foreign Application Priority Data

Feb. 29, 2012 (JP) ................. 2012-043145

(51) Int. Cl.
| | |
|---|---|
| *B29C 65/00* | (2006.01) |
| *B32B 37/00* | (2006.01) |
| *H05K 13/04* | (2006.01) |
| *H05K 5/06* | (2006.01) |
| *H05K 5/00* | (2006.01) |
| *H03H 9/10* | (2006.01) |

(52) U.S. Cl.
CPC ............. *H05K 13/04* (2013.01); *H05K 5/069* (2013.01); *Y10T 403/52* (2015.01); *H05K 5/0095* (2013.01); *H03H 9/10* (2013.01)

(58) Field of Classification Search
CPC ........ B29C 65/00; B29C 65/02; B29C 65/40; B29C 65/42; B29C 65/48; B29C 65/4815; B29C 65/54; B29C 65/78; B29C 65/7802; B29C 65/7805; B29C 65/7808; B29C 66/00; B29C 66/001; B29C 66/00145; B29C 66/02; B29C 66/022; B32B 3/00; B32B 3/30; B32B 3/26; B32B 7/00; B32B 7/04; B32B 7/12; B32B 37/00; B32B 37/04; B32B 37/10; B32B 37/1018; B32B 37/12; B32B 37/1207; B32B 37/1215
USPC .......... 156/285, 286, 382; 264/511, 553, 554, 264/571, 101, 102; 425/504, 388, 405.1, 425/405.2
See application file for complete search history.

(56) References Cited

FOREIGN PATENT DOCUMENTS

| | | |
|---|---|---|
| JP | A 1-151813 | 6/1989 |
| JP | A 2004-289238 | 10/2004 |
| JP | A 2006-261684 | 9/2006 |
| JP | A 2013-16657 | 1/2013 |

*Primary Examiner* — Michael N Orlando
*Assistant Examiner* — Matthew Hoover
(74) *Attorney, Agent, or Firm* — Oliff PLC

(57) ABSTRACT

A base member includes a mounting area where an electronic component can be mounted and a ring-shaped sealing surface surrounding the area as the area is viewed in a plan view. A sealing member is fixed on the sealing surface. A through-hole portion which is a recess partitioned by a wall surface of the sealing member and which connects the mounting area and an outer peripheral side of the sealing surface as viewed in a plan view is provided on the sealing surface. A manufacturing method for an electronic device using this base member is also provided.

3 Claims, 9 Drawing Sheets

BASE MEMBER, MANUFACTURING METHOD FOR ELECTRONIC DEVICE, AND ELECTRONIC APPARATUS

BACKGROUND

1. Technical Field

The present invention relates to a manufacturing method for an electronic device having a configuration in which the inside of a package is sealed in a reduced pressure state, and an electronic apparatus having an electronic device that is manufactured by this manufacturing method.

2. Related Art

According to the related art, as a manufacturing method for an electronic device having a configuration in which the inside of a package is sealed in a reduced pressure state, it is common to provide a through-hole that connects the outside and an inner space, in a bottom side section of the package, discharging gas from the inner space through the through-hole under reduced pressure, and then filling the through-hole with a sealing material. Therefore, it is difficult to reduce the thickness of the package bottom section of the electronic device where the through-hole is provided, in view of the strength and flatness of the bottom side. Moreover, reducing the thickness of the bottom side may cause the sealing material to flow easily, thus posing the risk of generating a short circuit in wiring or the like. Thus, JP-A-2004-289238 discloses an electronic device having a configuration in which a through-hole is formed on a lateral side of a package so that reduction in the thickness of the package or the like is possible. According to this electronic device, in addition to the reduction in thickness due to improved strength of the bottom side of the package, improvements such as restraining the flow of the sealing material and preventing a short circuit can be realized because of the provision of the through-hole on the lateral side which can be set to be thicker than the bottom side. Therefore, improved quality is realized.

However, in the related-art technique, in order to seal the through-hole, a process simply for sealing the through-hole, in which the sealing material is placed in the through-hole and then heated or the like, is commonly carried out. Also, since the sealing material and the package material are different materials, there is a problem that a boundary between the different materials appears in the sealed portion, thus lowering sealing strength and package strength as the package is reduced in size and thickness.

SUMMARY

An advantage of some aspects of the invention is to solve at least a part of the problems described above, and the invention can be implemented as the following application examples or forms.

Application Example 1

This application example is directed to a base member including a mounting area where an electronic component can be mounted, and a ring-shaped sealing surface surrounding the mounting area as the mounting area is viewed in a plan view. A sealing member is fixed on the sealing surface. A through-hole portion which is a recess partitioned by a wall surface of the sealing member and which connects the mounting area and an outer peripheral side of the sealing surface as viewed in a plan view is provided on the sealing surface.

Application Example 2

This application example is directed to the base member according to the application example described above, wherein an exposed surface of the sealing member in the through-hole portion is situated more toward the sealing surface side than an exposed surface of another part of the sealing member.

Application Example 3

This application example is directed to the base member according to the application example described above, wherein the sealing member is fixed to the sealing surface with the through-hole portion situated in between.

Application Example 4

This application example is directed to the base member according to the application example described above, wherein the sealing member is made of a material that melts by heating.

Application Example 5

This application example is directed to the base member according to the application example described above, wherein the through-hole portion has a wedge-shaped cross-sectional shape.

Application Example 6

This application example is directed to a manufacturing method for an electronic device including: preparing a base member including a mounting area where an electronic component can be mounted and a ring-shaped sealing surface surrounding the mounting area as the mounting area is viewed in a plan view, in which a sealing member is fixed on the sealing surface, and a through-hole portion that is a recess partitioned by a wall surface of the sealing member and that connects the mounting area and an outer peripheral side of the sealing surface as viewed in a plan view is provided on the sealing surface; arranging an electronic component in the mounting area; installing a lid member on the base member via the sealing member so as to cover the electronic component; reducing pressure by exposing the base member, the sealing member and the lid member to a reduced pressure atmosphere; and melting the sealing member in the reduced pressure atmosphere and thus closing the through-hole portion with the sealing member.

According to the manufacturing method for the electronic device of this application example, the important point is that, in the preparation of the base member, the sealing member provided on the base member has the through-hole portion. This through-hole portion connects the space formed by the lid member and the base member and accommodating the electronic component and the outside of the base member even when the lid member is installed with the sealing portion held between the base member and the lid member in the lid member installation process. In this state, in the pressure reduction, air or the like in the space is discharged from the through-hole portion and the space becomes a reduced pressure state. Moreover, as heating is carried out in the heating process, the sealing member properly melts and moves to fill the through-hole portion, thus closing the connecting state. That is, the through-hole portion is a site for drawing air or the like from the space and thus forming a reduced pressure atmosphere in the space. When the space has the reduced pressure atmosphere and is then heated, the molten sealing member fills the through-hole portion. Thus, the space is airtightly closed in the state of reduced pressure atmosphere.

With such a manufacturing process, sealing strength is maintained and reduction in strength of the base member or the like is restrained, thus enabling reduction in the size and thickness of the electronic device, compared with the related-art technique in which a pressure-reduction exhaust hole is provided in the base member or the like and is filled with a sealing material that is different from the base member. Also, with this manufacturing method for the electronic device, joining the base member and the lid member to each other and closing the through-hole portion can be carried out in the single process of heating, thus contributing to reduction in the number of processes.

Application Example 7

In the manufacturing method for the electronic device according to the application example described above, it is preferable that the preparation of the base member includes arranging the sealing member on the base member, and forming the through-hole portion in the sealing member after the arrangement of the sealing member.

According to this configuration, the through-hole portion is formed by first arranging the sealing member on the base member and then physically processing the sealing member, for example, by chemical treatment such as etching, or mechanical processing. That is, the through-hole is processed by an optimum technique for the sealing member.

Application Example 8

In the manufacturing method for the electronic device according to the application example described above, it is preferable that the preparation of the base member includes forming the through-hole portion, and that the formation of the through-hole portion includes pressurizing a part of the sealing member before the through-hole portion is formed, and thus forming the through-hole portion.

According to this configuration, the through-hole portion is formed in a shape corresponding to the pressurizing member. The generation of stress and processing strain or the like in the sealing member is restrained, and the through-hole portion can be formed easily.

Application Example 9

In the manufacturing method for the electronic device according to the application example described above, it is preferable that the formation of the through-hole portion further includes arranging a supplementary sealing member in the through-hole portion.

According to this configuration, the supplementary sealing member is further arranged in the through-hole portion provided in the sealing member. The through-hole portion connects the space accommodating the electronic component and the outside of the base member even when the supplementary sealing member is arranged. In this case, it is preferable that the supplementary sealing member is made of the same material as the sealing member that joins the base member and the lid member to each other. Thus, in the manufacturing method for the electronic device, by further including the arrangement of the supplementary sealing member, the flow of the sealing member can be restrained as much as possible while exhaust and pressure reduction in the space is carried out at the time of closing the through-hole portion in the heating process. Thus, more secure closing can be carried out.

Application Example 10

In the manufacturing method for the electronic device according to the application example described above, it is preferable that the through-hole portion has a wedge shape.

According to this configuration, since the through-hole portion of the sealing member has a wedge shape, the through-hole portion is not easily deformed or the like even when the sealing member is held between the base member and the lid member. Thus, pressure reduction and exhaust can be carried out securely. Also, when closing the through-hole portion in the heating process, the sealing member part situated at the tip part of the wedge shape tends to be welded and fills and closes the through-hole portion in order from this tip part. Therefore, the sealing member around the through-hole portion can smoothly flow and close the through-hole portion. Thus, in the electronic device manufactured by the manufacturing method for the electronic device, reduction in sealing strength and joining strength between the base member and the lid member or the like can be restrained and high strength can be maintained.

Application Example 11

This application example is directed to a manufacturing method for an electronic device including a base member on which an electronic component is mounted, a lid member which forms, together with the base member, a space for accommodating the electronic component, and a sealing member which joins the base member and the lid member to each other and holds the space in a reduced pressure atmosphere. An exhaust portion for reducing pressure and exhausting air from the space is provided on a surface of the base member or the lid member that faces the sealing member. The method includes: preparing the base member on which the sealing member is arranged, and the lid member; installing the lid member on the base member via the sealing member; reducing pressure by exposing the base member, the sealing member and the lid member to a reduced pressure atmosphere; and heating and melting the sealing member in the reduced pressure atmosphere and thus joining the base member and the lid member to each other and closing the exhaust portion.

According to the manufacturing method for the electronic device of this application example, the important point is that the exhaust portion is formed in the base member or the lid member in the preparation of the two members. The exhaust portion that is formed connects the space formed by the lid member and the base member and the outside of the base member even when the lid member is installed with the sealing portion held between the base member and the lid member in the lid member installation process. In this state, in the pressure reduction, air or the like in the space is discharged from the exhaust portion and the space becomes a reduced pressure state. Moreover, as heating is carried out in the heating process, the sealing portion properly melts and joins the base member and the lid member to each other and also moves to fill the exhaust portion, thus closing the connecting state. That is, the exhaust portion is a site for drawing air or the like from the space and thus forming a reduced pressure atmosphere in the space. When the space has the reduced pressure atmosphere and is then heated, the molten sealing member fills the exhaust portion. Thus, the space is airtightly closed in the state of reduced pressure atmosphere. With such a manufacturing process, sealing strength is maintained and reduction in strength of the base member or the like is restrained, thus enabling reduction in the size and thickness of the electronic device, compared with the related-art technique in which a pressure-reduction exhaust hole is provided in the base member or the like and is filled with a sealing material that is different from the base member. Also, with this manufacturing method for the electronic device, joining the base member and the lid member to each other and closing the exhaust portion can be carried out in the single process of heating, thus contributing to reduction in the number of processes.

Application Example 12

In the manufacturing method for the electronic device according to the application example described above, it is preferable that a supplementary sealing member is arranged in the exhaust portion before the heating.

According to this configuration, the supplementary sealing member is arranged in the exhaust portion in the process before the heating. The exhaust portion connects the space accommodating the electronic component and the outside of the base member even when the supplementary sealing member is arranged. In this case, it is preferable that the supplementary sealing member is made of the same material as the sealing member that joins the base member and the lid member to each other. Thus, in the manufacturing method for the electronic device, the flow of the sealing member can be restrained as much as possible while exhaust and pressure reduction in the space is carried out at the time of closing the exhaust portion in the heating process. Thus, more secure closing can be carried out.

Application Example 13

This application example is directed to an electronic apparatus including an electronic device which is manufactured by the above manufacturing method for the electronic device.

The electronic apparatus of this application example has the electronic device manufactured by the manufacturing method for the electronic device. In this electronic device, high sealing strength and high joining strength between the base member and the lid member can be maintained. The electronic component accommodated inside is maintained to a reduced pressure atmosphere and deterioration in performance thereof can be restrained. Also, the electronic device can be reduced in size and thickness. Thus, performance of the electronic apparatus can be maintained for a long period despite the small size and thin thickness thereof.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred examples of a manufacturing method for an electronic device according to the embodiment will be described with reference to the accompanying drawings. Here, taking a crystal resonator as an example of the electronic device, the configuration thereof and a manufacturing method will be described.

Embodiment 1

Figure 1:
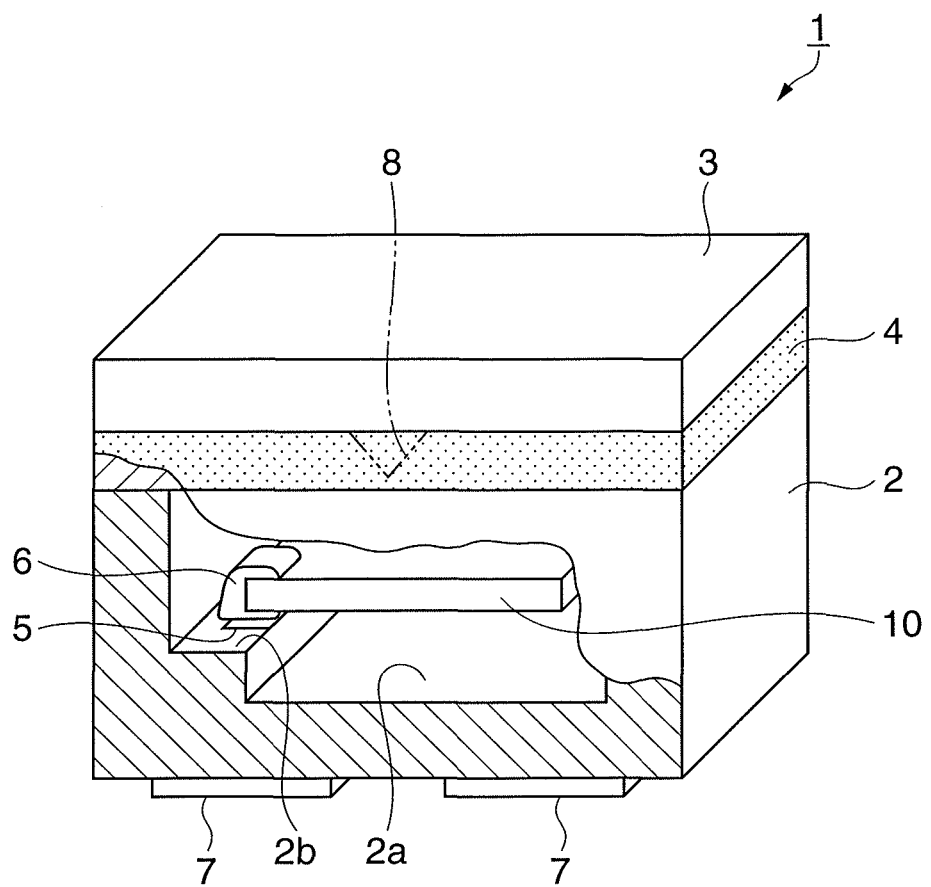
FIG. 1 is a perspective view showing a crystal oscillator (electronic device) according to Embodiment 1.

FIG. 1 is a perspective view showing a crystal resonator (electronic device) according to Embodiment 1. As shown in FIG. 1, a crystal resonator 1 includes a base member 2 in the shape of a rectangular parallelepiped and having a space 2a formed inside, a step portion 2b provided on the side of the space 2a of the base member 2, a lid member 3 for forming the space 2a together with the base member 2, a sealing member 4 for joining the base member 2 and the lid member 3 to each other and sealing the space 2a, and a resonator element 10 formed with a quartz crystal installed on the step portion 2b. A step portion terminal 5 is also provided on the step portion 2b. The resonator element 10 is adhered and fixed to the step portion 2b with an electrically conductive adhesive 6 in the state where the resonator element 10 is electrically connected with the step portion terminal 5. The step portion terminal is electrically connected with an external terminal 7 provided on an outer surface of the base member 2. In this case, the base member 2 and the lid member 3 are made of ceramic. The sealing member 4 is made of a low-melting glass which melts at 320 to 330° C. and functions as a brazing material which joins the base member 2 and the lid member 3 to each other. In the crystal resonator 1 with such a configuration, when a drive current is applied to the external terminal 7 from outside, the resonator element 10 is excited and can oscillate at a predetermined frequency.

Here, since the crystal resonator 1 is heated in a reduced pressure state when the base member 2, the lid member 3 are joined and sealed to each other by the sealing member 4, a reduced pressure atmosphere is formed in the space 2a accommodating the resonator element 10. In the space 2a accommodating the resonator element 10, not only a reduce pressure atmosphere but also an atmosphere filled with inert gas such as nitrogen, helium or argon may be formed. The crystal resonator 1 has a configuration in which a reduced pressure atmosphere can be formed efficiently in the space 2a since the sealing member 4 has a through-hole portion 8, which will be described later with reference to FIG. 3B.

Figure 2:
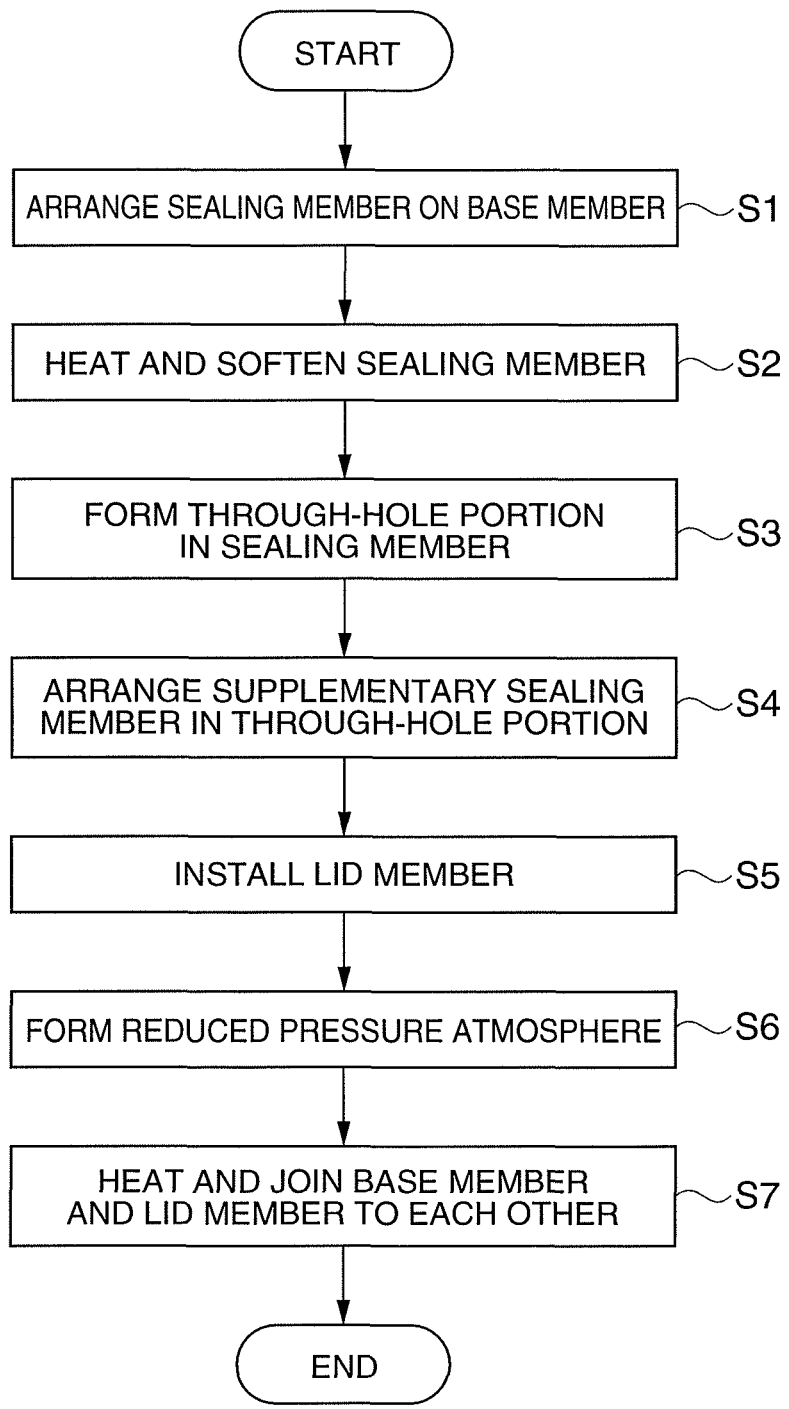
FIG. 2 is a flowchart showing a manufacturing method for the crystal resonator according to Embodiment 1.
Figure 3A:
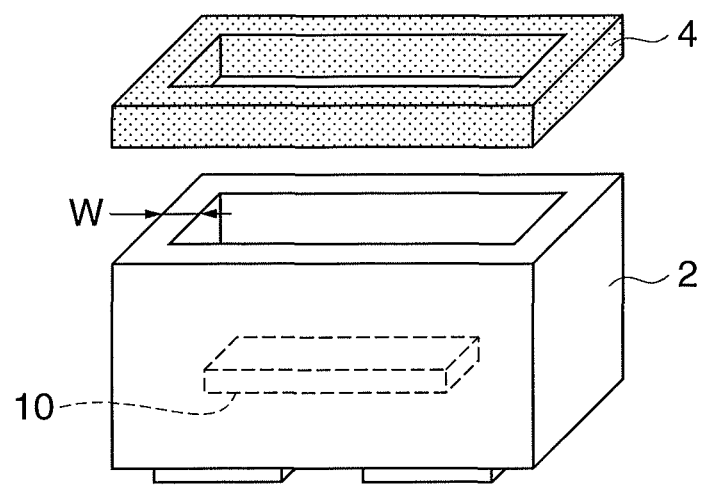
FIG. 3A is a perspective view showing the arrangement of a sealing member on a base member.
Figure 3B:
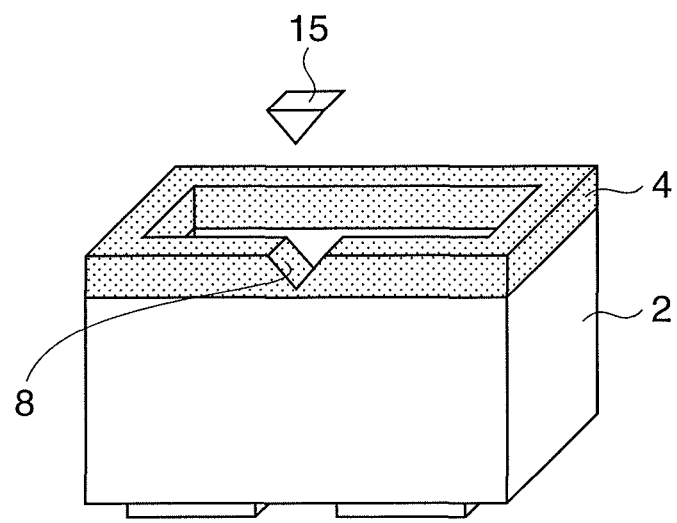
FIG. 3B is a perspective view showing the formation of a through-hole portion in the sealing member.
Figure 4C:
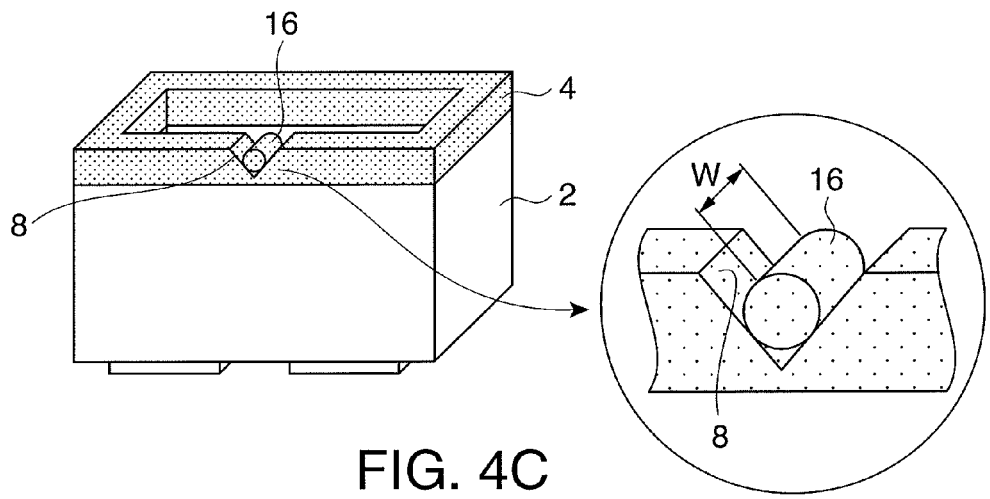
FIG. 4C is a perspective view showing the arrangement of a supplementary sealing member.
Figure 4D:
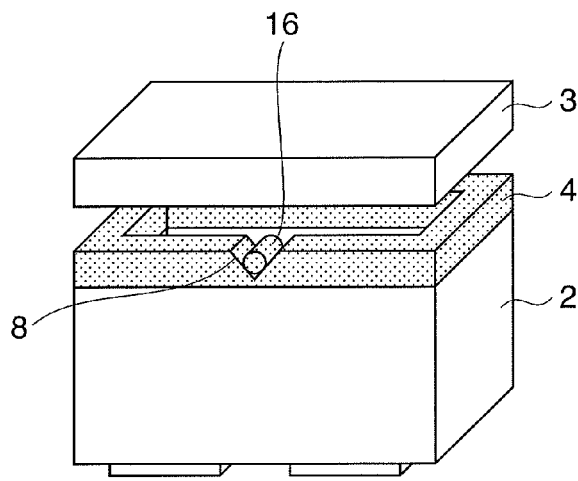
FIG. 4D is a perspective view showing the installation of a lid member.
Figure 4E:
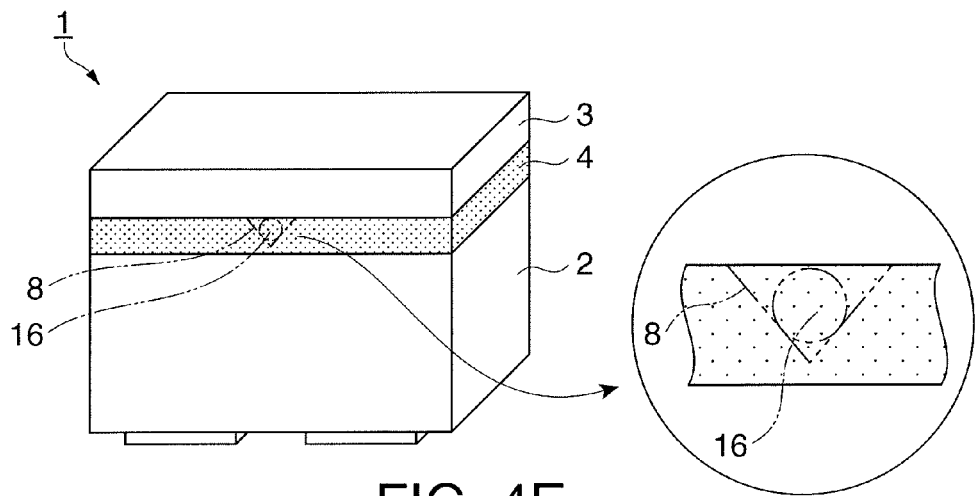
FIG. 4E is a perspective view showing the electronic device after heating.

Hereinafter, a manufacturing method for the crystal resonator 1 will be described. FIG. 2 is a flowchart showing the manufacturing method for the crystal resonator according to Embodiment 1. FIG. 3A is a perspective view showing the arrangement of the sealing member on the base member. FIG. 3B is a perspective view showing the formation of the through-pole portion in the sealing member. FIG. 4C is a perspective view showing the arrangement of a supplementary sealing member. FIG. 4D is a perspective view showing the installation of the lid member. FIG. 4E is a perspective view showing the electronic device after heating.

In the manufacturing method for the crystal resonator 1, first, in step S1, the sealing member 4 is arranged on the base member 2, as shown in the flowchart of FIG. 2. The position where the sealing member 4 is arranged is an end part on the opening side of the space 2*a*, of the base member 2, as shown in FIG. 3A. The sealing member 4 arranged at this end part surrounds the entire circumference of this opening. In this case, the end part of the base member 2 is ring-shaped with a width W, as viewed in a plan view. Similarly the sealing member 4 is ring-shaped with a width W, as viewed in a plan view. Therefore, the sealing member 4 is arranged, overlapping the entire area of the end part of the base member 2. Step S1 is equivalent to a sealing member arrangement process. After the sealing member 4 is arranged, the processing goes to step S2.

In step S2, the sealing member 4 is heated and softened. This heating and softening processing is carried out in order to heat and soften the sealing member 4 made of a low-melting glass to approximately 250° C., which is lower than the melting point. The sealing member 4, softened in this processing, can be deformed freely, for example, by external pressure or the like. Step S2 is equivalent to a heating and softening process. After the sealing member 4 is softened, the processing goes to step S3.

In step S3, the through-hole portion 8 is formed in the sealing member 4. The through-hole portion 8 is formed by pressing a pressurizing member 15 against the softened sealing member 4, as shown in FIG. 3B. In this case, the pressurizing member 15 is in the form of a triangular prism and is arranged to extend from the side of the space 2*a*, which is the inner side of the base member 2, to the outer side of the base member 2. As a predetermined vertex part of the triangle in the pressurizing member 15 is gradually pressed against the sealing member 4, a wedge-shaped groove is formed in the sealing member 4. This wedge-shaped groove is the through-hole portion 8. The through-hole portion 8 penetrates the base member 2 from the side of the space 2*a* of the base member 2 to the outer side of the base member 2. By thus utilizing the softening of the sealing member 4 to form the through-hole portion 8, the through-hole portion 8 can be formed easily while restraining generation of stress, processing strain or the like in the sealing member 4. In this case, it can be said that the sealing member 4 has a configuration in which a part of the surface of the base member 2 that is joined to the lid member 3 has a protruding part in the base member 2 via the through-hole portion 8 so as to reduce pressure and exhaust air from the space 2*a*. It can be considered that the sealing member 4 is provided around the place in the base member 2 where the resonator element (electronic component) 10 is mounted. Step S3 is equivalent to a pressurizing process. Step S2 together with step S3 is equivalent to a through-hole portion forming process. Also, steps S1, S2 and S3 collectively correspond to the preparation of the base member. After the through-hole portion 8 is formed, the processing goes to step S4.

In step S4, a supplementary sealing member 16 is arranged in the through-hole portion 8. The supplementary sealing member 16 is in the shape of a circular column with a length W as shown in FIG. 4C and made of the same material as the sealing member 4. The supplementary sealing member 16 is arranged along the through-hole portion 8. Step S4 is equivalent to a supplementary sealing member arrangement process. After the supplementary sealing member 16 is arranged the processing goes to step S5.

In step S5, the lid member 3 is installed. The lid member 3 is installed to fill the opening of the space 2*a* via the sealing member 4, as shown in FIG. 4D. The space 2*a* and the outside of the base member 2 are connected to each other via the through-hole portion 8 even when the lid member 3 is installed. In this case, it is preferable that the supplementary sealing member 16 does not protrude to the side of the lid member 3 from the wedge-shaped through-hole portion 8. Step S5 is equivalent to a lid member installation process. After the lid member 3 is installed, the processing goes to step S6.

In step S6, a reduced pressure atmosphere is formed. That is, the base member 2, the lid member 3, the sealing member 4 and the supplementary sealing member 16 configured as shown in FIG. 4D are placed in a chamber or the like and pressure is reduced therein. As a reduced pressure atmosphere is formed in the chamber or the like, the air in the space 2*a* is sucked to the outside of the base member 2 from the through-hole portion 8 and a reduced pressure atmosphere is formed also in the space 2*a*. Step S6 is equivalent to a pressure reduction process. After the reduced pressure atmosphere is formed, the processing goes to step S7.

In step S7, the base member 2 and the lid member 3 are heated and joined to each other. That is, as the base member 2, the lid member 3, the sealing member 4 and the supplementary sealing member 16 are heated to a temperature close to the melting temperature of the sealing member 4 and the supplementary sealing member 16 in the reduced pressure atmosphere, the tip part of the wedge shape of the through-hole portion 8 in the sealing member 4 melts and the sealing member surfaces forming the through-hole portion 8 start being welded to each other first. Therefore, the through-hole portion 8 is filled and closed in order from this tip part. Moreover, since the supplementary sealing member 16 arranged in the through-hole portion 8 melts and fills the through-hole portion 8, the melting and flowing of the sealing member surfaces forming the through-hole portion 8 is restrained, compared with the case where the supplementary sealing member 16 is not provided. Thus, the sealing member 4 can smoothly flow and close the through-hole portion 8 without excessively flowing. Step S7 is equivalent to a heating process. Thus, the processing flow ends.

In the crystal resonator (electronic device) 1 manufactured by such a manufacturing method, the sealing strength of the sealing member 4 is high and reduction in the joining strength or the like between the base member 2 and the lid member 3 can be restrained, thus maintaining high strength. Also, since the joining between the base member 2 and the lid member 3 and the closing of the through-hole portion 8 can be carried out in the single step of heating, the number of process steps can be reduced.

Embodiment 2

Figure 5:
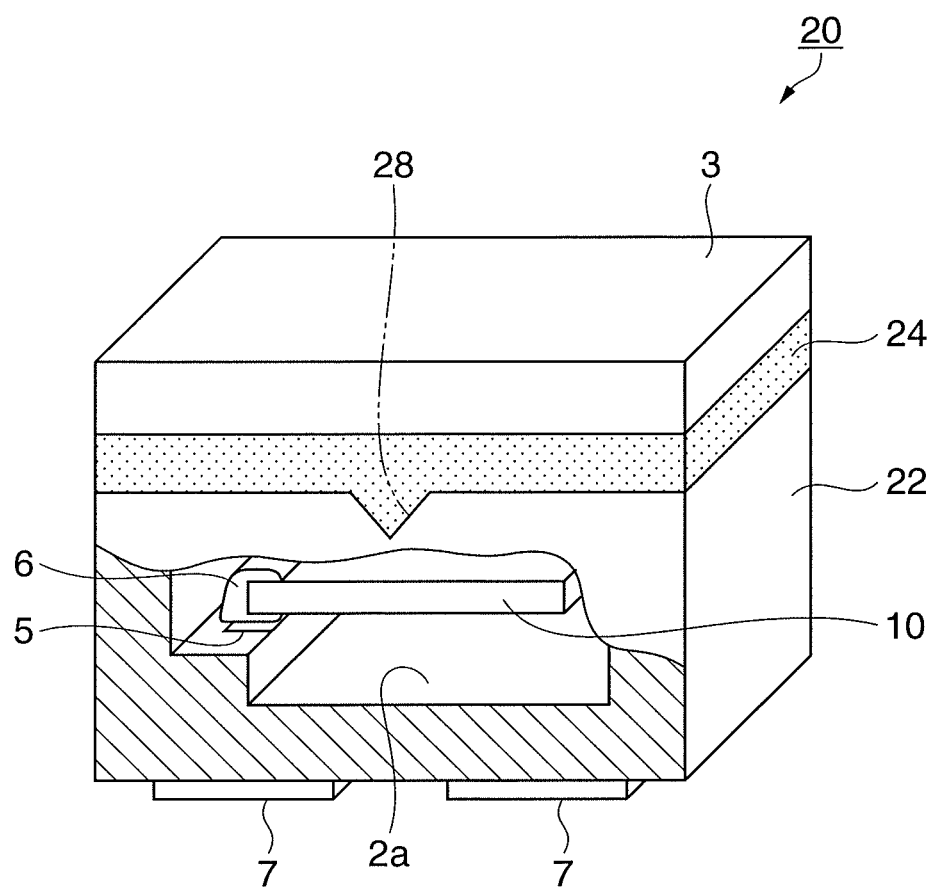
FIG. 5 is a perspective view showing a crystal resonator (electronic device) according to Embodiment 2.

Next, another preferred example of the manufacturing method for the electronic device will be described. FIG. 5 is a perspective view showing a crystal resonator (electronic device) according to Embodiment 2. A crystal resonator 20 according to Embodiment 2 and the crystal resonator 1 according to Embodiment 1 differ in the position where the through-hole portion is formed. Therefore, in the description of the crystal resonator 20, the same parts of the configuration as in the crystal resonator 1 are denoted by the same reference numerals and will not be described further in detail, whereas different parts of the configuration are denoted by different reference numerals and will be described further.

As shown in FIG. 5, the crystal resonator 20 includes a base member 22 in the shape of a rectangular parallelepiped and having a space 2a formed inside, a lid member 3, a sealing member 24 for joining the base member 22 and the lid member 3 to each other and sealing the space 2a, and a resonator element 10. The base member 22 has an exhaust portion 28, which will be described later with reference to FIG. 7A, on the side where the sealing member 24 is arranged. This exhaust portion 28 plays a similar role to the through-hole portion 8 in the crystal resonator 1 of Embodiment 1. In this case, the base member 22 and the lid member 3 are made of ceramic. The sealing member 24 is made of a low-melting glass which melts at 320 to 330° C. and functions as a brazing material. In the crystal resonator 20 with such a configuration, when a drive current is applied to the external terminal 7 from outside, the resonator element 10 is excited and can oscillate at a predetermined frequency.

Figure 6:
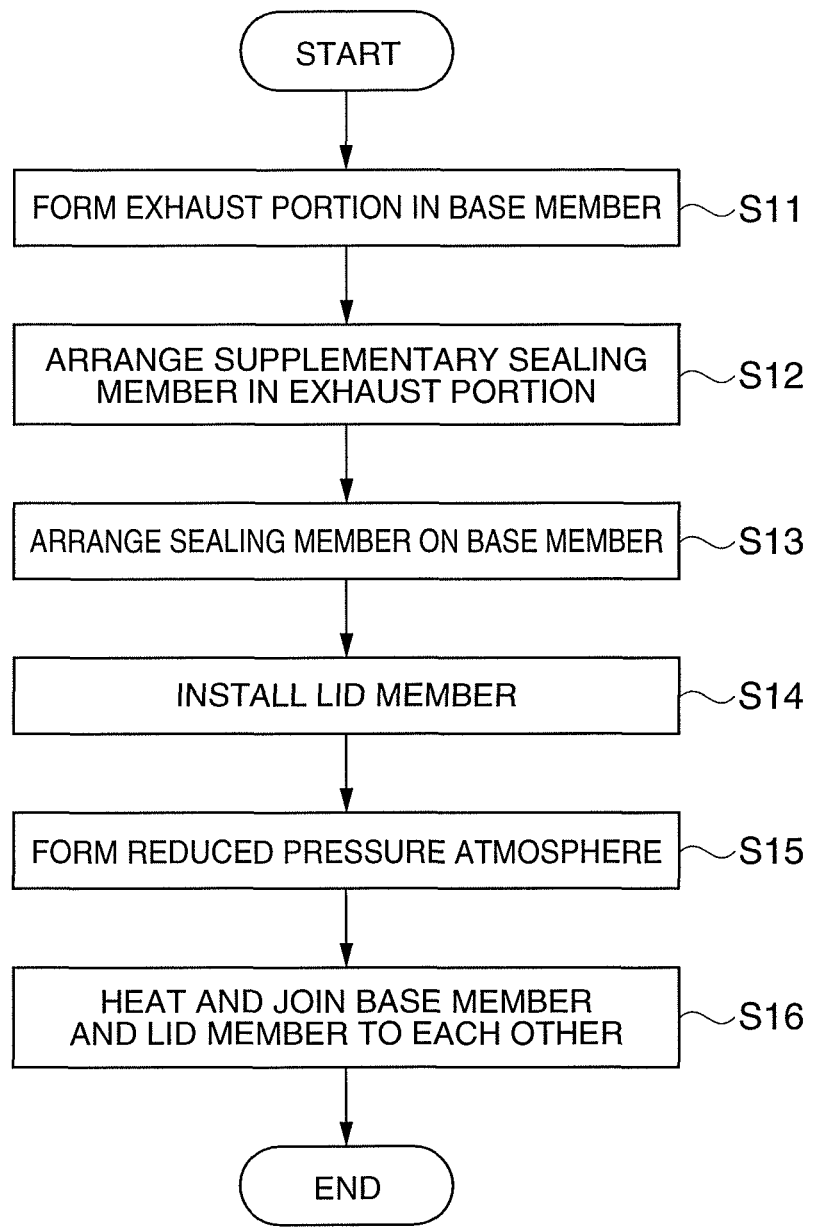
FIG. 6 is a flowchart showing a manufacturing method for the crystal resonator according to Embodiment 2.
Figure 7A:
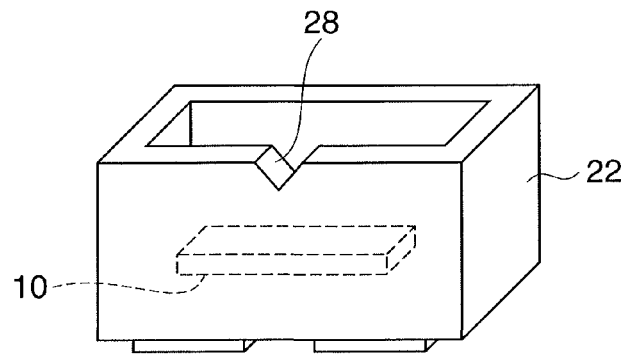
FIG. 7A is a perspective view showing the formation of an exhaust portion in a base member.
Figure 7B:
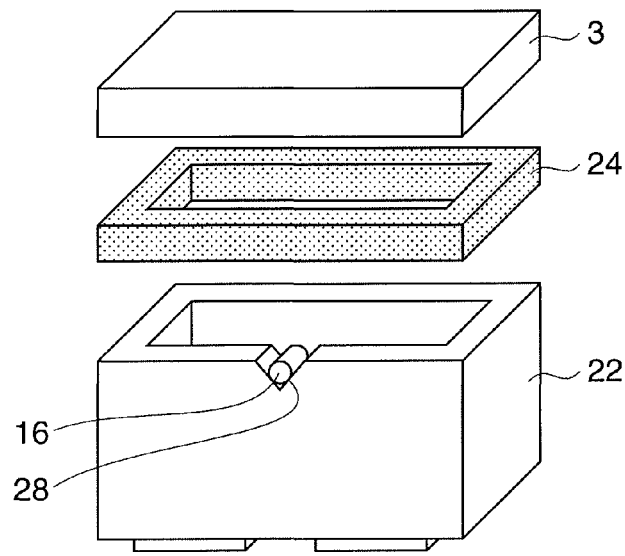
FIG. 7B is a perspective view showing the installation of a sealing member and a lid member.
Figure 7C:
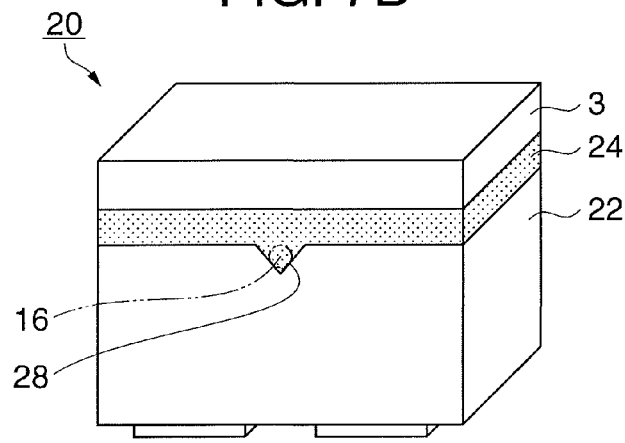
FIG. 7C is a perspective view showing the electronic device after heating.

Hereinafter, a manufacturing method for the crystal resonator 20 will be described. FIG. 6 is a flowchart showing the manufacturing method for the crystal resonator according to Embodiment 2. FIG. 7A is a perspective view showing the formation of the exhaust portion in the base member. FIG. 7B is a perspective view showing the installation of the sealing member and the lid member. FIG. 7C is a perspective view showing the electronic device after heating.

In the manufacturing method for the crystal resonator 20, first, in step S11, the exhaust portion 28 is formed in the base member 22, as shown in the flowchart of FIG. 6. The exhaust portion 28 is a wedge-shaped groove formed at an end part on the side of the lid member 3, of the space 2a in the base member 22, and is provided to penetrate the base member 22 from the side of the space 2a of the base member 22 to the outside of the base member 22 as shown in FIG. 7A. The exhaust portion 28 is formed at the same time when the base member 22 is formed with ceramic. Step S11 is not a step to form the exhaust portion 28 alone. Meanwhile, after the base member 22 is formed, the exhaust portion 28 can also be formed by mechanical processing or the like in step S11. After the exhaust portion 28 is formed, the processing goes to step S12.

In step S12, a supplementary sealing member 16 is arranged in the exhaust portion 28. The supplementary sealing member 16 is in the shape of a circular column as shown in FIG. 7B and made of the same material as the sealing member 24. The supplementary sealing member 16 is arranged along the exhaust portion 28. It is preferable that the supplementary sealing member 16 is arranged in the exhaust portion 28 in a process prior to a heating process, which will be described later. In this case, the arrangement is carried out in step S12. After the supplementary sealing member 16 is arranged, the processing goes to step S13.

In step S13, the sealing member 24 is arranged on the base member 22. The position where the sealing member 24 is arranged is the end part of the base member 22 where the exhaust portion 28 is formed, as shown in FIG. 7B. The sealing member 24 arranged at this end part surrounds the entire circumference of the opening of the space 2a. Steps S11 and S13 are equivalent to a base member and lid member forming process. After the sealing member 24 is arranged, the processing goes to step S14.

In step S14, the lid member 3 is installed. The lid member 3 is installed to fill the opening of the space 2a via the sealing member 24, as shown in FIG. 7B. The space 2a and the outside of the base member 22 are connected to each other via the exhaust portion 28 even when the lid member 3 is installed. In this case, it is preferable that the supplementary sealing member 16 does not protrude to the side of the sealing member 24 from the wedge-shaped exhaust portion 28. Step S14 is equivalent to a lid member installation process. After the lid member 3 is installed, the processing goes to step S15.

In step S15, a reduced pressure atmosphere is formed. That is, the base member 22, the lid member 3, the sealing member 24 and the supplementary sealing member 16 configured as shown in FIG. 7B are superimposed on each other and placed in a chamber or the like, and the pressure is reduced. As a reduced pressure atmosphere is formed in the chamber or the like, the air in the space 2a is sucked to the outside of the base member 22 from the exhaust portion 28 and a reduced pressure atmosphere is formed also in the space 2a. Step S15 is equivalent to a pressure reduction process. After the reduced pressure atmosphere is formed, the processing goes to step S16.

In step S16, the base member 22 and the lid member 3 are heated and joined to each other. That is, as the base member 22, the lid member 3, the sealing member 24 and the supplementary sealing member 16 are heated to a temperature close to the melting temperature of the sealing member 24 and the supplementary sealing member 16 in the reduced pressure atmosphere, the sealing member 24 and the supplementary sealing member 16 melt and flow into the exhaust portion 28 and thus fill and close the exhaust portion 28. Here, the closing of the exhaust portion 28 is possible without the supplementary sealing member 16. However, since the supplementary sealing member 16 is arranged, the supplementary sealing member 16 as well as the sealing member 24 melts and fills the exhaust portion 28. Therefore, an excessive flow of the sealing member 24 can be restrained and the exhaust portion 28 can be closed smoothly. Step S16 is equivalent to a heating process. Thus, the processing flow ends.

In the crystal resonator (electronic device) 20 manufactured by such a manufacturing method, the sealing strength of the sealing member 24 is high and reduction in the joining strength or the like between the base member 22 and the lid member 3 can be restrained, thus maintaining high strength. Also, since the exhaust portion 28 is formed when the base member 22 is formed, a process to form the exhaust portion 28 only is not necessary. Moreover, since the joining of the base member 22 and the lid member 3 and the closing of the exhaust portion 28 can be carried out in the single process of heating, the number of process steps can be reduced.

Electronic Apparatus

Figure 8A:
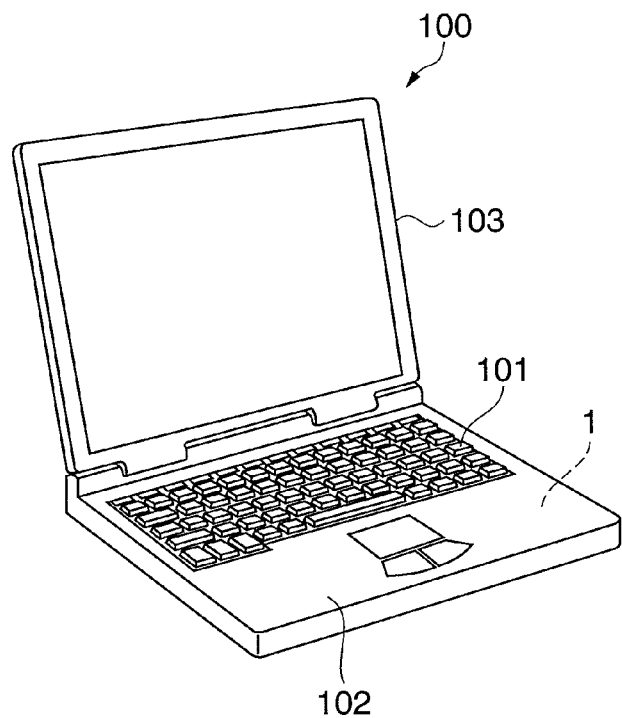
FIG. 8A is a perspective view showing a personal computer (electronic apparatus).
Figure 8B:
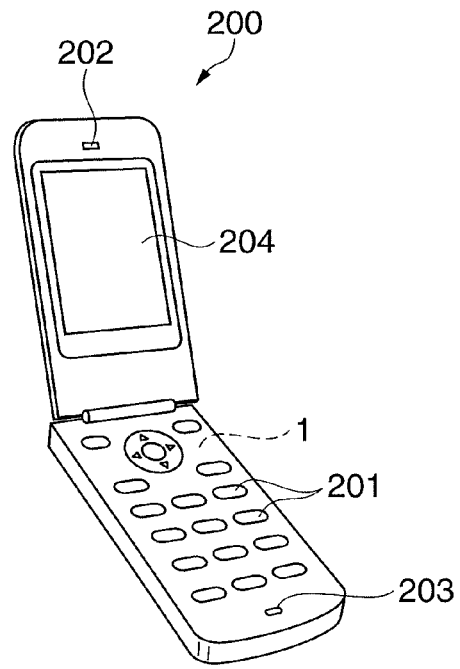
FIG. 8B is a perspective view showing a mobile phone (electronic apparatus).

Next, an electronic apparatus according to an embodiment of the invention will be described. The electronic apparatus is equipped with the crystal resonator 1 manufactured based on the flowchart of FIG. 2. FIG. 8A is a perspective view showing a personal computer (electronic apparatus). FIG. 8B is a perspective view showing a mobile phone (electronic apparatus).

As shown in FIG. 8A, a personal computer 100 includes a main body unit 102 having a keyboard 101, and a display unit 103. The display unit 103 is rotatably supported on the main body unit 102 via a hinge structure. In such a personal computer 100, the crystal resonator 1, which is an electronic device, is installed and tolerates vibration, shock and the like that occur when the personal computer 100 is carried, thus contributing to the maintenance of the performance of the personal computer 100.

Also, as shown in FIG. 8B, a mobile phone 200 includes plural operation buttons 201, a receiver port 202, a transmitter port 203, and an antenna (not shown). A display unit 204 is arranged between the operation buttons 201 and the receiver port 202. In such a mobile phone 200, the crystal resonator 1, which is an electronic device, is installed and tolerates vibration, shock and the like that occur when the mobile phone 200 is carried, thus contributing to the maintenance of the performance of the mobile phone 200.

The manufacturing method for the above-described electronic devices is not limited to the form described in each embodiment. Forms as in the following modifications can achieve similar effects to the embodiments.

Modification 1

Figure 9A:
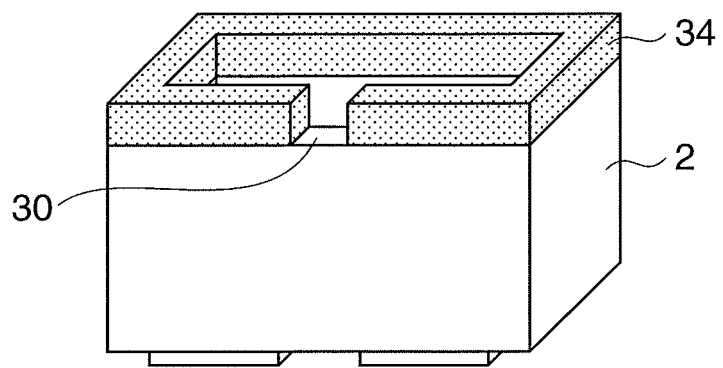
FIG. 9A is a perspective view showing a modification of the through-hole portion.

In the crystal resonator 1, the through-hole portion 8 of the sealing member 4 is wedge-shaped. However, the shape is not limited to this example. For example, FIG. 9A is a perspective view showing a modification of the through-hole portion. As shown in FIG. 9A, a sealing member 34 is not continuous in a ring shape but is discontinuous, with a portion cut out. This cut-out portion is a through-hole portion 30. The through-hole portion 30 connects the inside of the base member 2 to the outside of the base member 2 even when the sealing member 34 is arranged on the base member 2 and the lid member 3 (not shown) is installed. As the base member 2, the lid member 3 and the sealing member 34 are heated in a reduced pressure atmosphere, the air inside the base member 2 is sucked to the outside of the base member 2 from the through-hole portion 30 and a reduced pressure atmosphere is formed inside the base member 2. Then, the sealing member 34 melts and can fill and close the through-hole portion 30. In this case, it can be said that the sealing member 34 on the base member 2 has a configuration in which a part on the surface of the base member 2 that is joined to the lid member 3 has a protruding part on the base member 2 via the through-hole portion 30 so as to reduce pressure and exhaust air from the space 2a, and that the sealing member 34 is provided around the place in the base member 2 where the resonator element (electronic component) 10 is installed. The supplementary sealing member 16 as shown in FIG. 4C may be arranged in the through-hole portion 30.

Modification 2

Figure 9B:
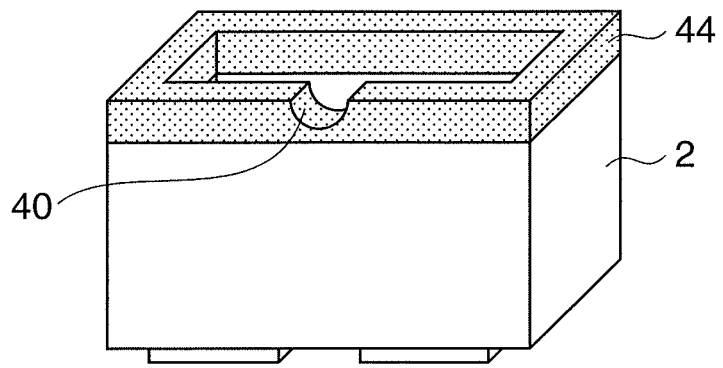
FIG. 9B is a perspective view showing a modification of the through-hole portion.

FIG. 9B is a perspective view showing a modification of the through-hole portion. The sealing member 44 as another modification is ring-shaped and a semicircular groove is formed at one part of the ring shape, as shown in FIG. 9B. This semicircular groove is a through-hole portion 40. The through-hole portion 40 connects the inside of the base member 2 to the outside of the base member 2 even when the sealing member 44 is arranged on the base member 2 and the lid member 3 (not shown) is installed. As the base member 2, the lid member 3 and the sealing member 44 are heated in a reduced pressure atmosphere, the sealing member 44 melts and then fills and closes the through-hole portion 40. The inside of the base member 2 is sealed in a reduced pressure atmosphere. In this case, too, the supplementary sealing member 16 as shown in FIG. 4C may be arranged in the through-hole portion 40.

Modification 3

Although only one through-hole portion 8 is formed in the sealing member 4 of Embodiment 1, plural through-hole portions 8 may be formed. Similarly, plural exhaust portions 28 may be formed in the base member 22 of Embodiment 2. Moreover, not all the plural through-hole portions 8 or exhaust portions 28 have to be in the wedge shape and combinations of different shapes may be employed. Also, while the supplementary sealing member 16 arranged in the through-hole portion 8 or the exhaust portion 28 has a circular columnar shape, other shapes such as elliptical column or polygonal column may be employed.

Modification 4

Although a low-melting glass is used for the sealing members 4, 24, other low-melting metals or alloys thereof, or resins and the like may also be used.

Modification 5

In the flowchart of FIG. 2, the through-hole portion forming process is not limited to the processing of steps S2 and S3. For example, the through-hole portion 8 may be formed in the sealing member 4 by mechanical processing, etching or the like. Also, it is possible to arrange the through-hole portion 8 alone, without arranging the supplementary sealing member 16. That is, a flowchart in which the supplementary sealing member arrangement process of step S4 is not carried out may be employed.

Modification 6

In the flowchart of FIG. 2, step S1 (the arrangement of the sealing member 4 on the base member 2) may be carried out after step S4 (the arrangement of the supplementary sealing member 16 in the through-hole portion 8). That is, in this flow, the sealing member 4 in which the formation of the through-hole portion 8 and the arrangement of the supplementary sealing member 16 are done is arranged on the base member 2.

Modification 7

In the crystal resonator 20 of Embodiment 2, the exhaust portion 28 is provided in the base member 22. However, the exhaust portion 28 may be provided in the lid member 3.

Modification 8

The personal computer 100 and the mobile phone 200 as electronic apparatuses are equipped with the crystal resonator 1. However, the personal computer 100 and the mobile phone 200 may be equipped with the crystal resonator 20. Also, the electronic apparatus may be a digital still camera, ink jet printer, television, video camera, car navigation system, electronic dictionary, electronic calculator, electronic game machine, surveillance monitor, medical equipment (for example, digital thermometer, sphygmomanometer, blood sugar meter, electrocardiography measuring system, ultrasonic diagnosis system, electronic endoscope) or the like, as well as the personal computer 100 and the mobile phone 200.

The entire disclosure of Japanese Patent Application No. 2012-043145, filed Feb. 29, 2012 is expressly incorporated by reference herein.

What is claimed is:
1. A manufacturing method for an electronic device, the method comprising:
    preparing a base member including a mounting area where an electronic component can be mounted and a ring-shaped sealing surface surrounding the mounting area as the mounting area is viewed in a plan view, in which a sealing member is fixed on the sealing surface, and a through-hole portion that is a recess partitioned by a wall surface of the sealing member and that connects the mounting area and an outer peripheral side of the sealing surface as viewed in a plan view is provided on the sealing surface;

arranging an electronic component in the mounting area;

installing a lid member on the base member via the sealing member so as to cover the electronic component;

reducing pressure by exposing the base member, the sealing member and the lid member to a reduced pressure atmosphere; and melting the sealing member in the reduced pressure atmosphere and thus closing the through-hole portion with the sealing member.

2. The manufacturing method for the electronic device according to claim 1, wherein the preparation of the base member includes forming the through-hole portion, and the formation of the through-hole portion includes pressurizing a part of the sealing member before the through-hole portion is formed, and thus forming the through-hole portion.

3. An electronic apparatus equipped with an electronic device manufactured by the manufacturing method for the electronic device according to claim 1.

* * * * *